(12) United States Patent
Shamblin

(10) Patent No.: US 11,688,939 B2
(45) Date of Patent: Jun. 27, 2023

(54) HORN ANTENNAS FOR USE IN A RADIO FREQUENCY ANECHOIC TEST CHAMBER

(71) Applicant: AVX Antenna, Inc., San Diego, CA (US)

(72) Inventor: John Eric Shamblin, San Diego, CA (US)

(73) Assignee: Kyocera AVX Components (San Diego), Inc., San Diego, CA (US)

( * ) Notice: Subject to any disclaimer, the term of this patent is extended or adjusted under 35 U.S.C. 154(b) by 94 days.

(21) Appl. No.: 16/940,485

(22) Filed: Jul. 28, 2020

(65) Prior Publication Data

US 2021/0036419 A1 Feb. 4, 2021

Related U.S. Application Data

(60) Provisional application No. 62/879,732, filed on Jul. 29, 2019.

(51) Int. Cl.
| | |
|---|---|
| *H01Q 1/52* | (2006.01) |
| *G01R 29/08* | (2006.01) |
| *H01Q 13/02* | (2006.01) |
| *H01Q 13/08* | (2006.01) |
| *H04B 17/30* | (2015.01) |

(52) U.S. Cl.
CPC ......... *H01Q 1/526* (2013.01); *G01R 29/0821* (2013.01); *G01R 29/0835* (2013.01); *H01Q 13/0225* (2013.01); *H01Q 13/085* (2013.01); *H04B 17/30* (2015.01)

(58) Field of Classification Search
CPC .. H01Q 1/526; H01Q 13/085; H01Q 13/0275; H01Q 13/0225; H04B 17/30; G01R 29/0821; G01R 29/0835
See application file for complete search history.

(56) References Cited

U.S. PATENT DOCUMENTS

| | | | | |
|---|---|---|---|---|
| 2005/0231436 | A1* | 10/2005 | McLean | H01Q 13/0275 343/786 |
| 2010/0078203 | A1* | 4/2010 | Lier | H01Q 15/0086 174/258 |
| 2015/0035707 | A1* | 2/2015 | Tankielun | H01Q 13/085 343/703 |
| 2018/0115077 | A1* | 4/2018 | Tankielun | H01Q 13/085 |
| 2020/0358538 | A1* | 11/2020 | Olgaard | H04B 17/0087 |

* cited by examiner

*Primary Examiner* — Robert Karacsony
(74) *Attorney, Agent, or Firm* — Dority & Manning, P.A.

(57) ABSTRACT

A horn antenna configured for use in a radio frequency (RF) anechoic test chamber is provided. The horn antenna includes one or more conductive radiating elements. The horn antenna further includes an electromagnetic interference (EMI) suppressing material covering at least a portion of a surface of the one or more conductive radiating elements such that the EMI suppressing material at least partially suppresses a surface current associated with the surface of the one or more conductive radiating elements during a test operation.

16 Claims, 15 Drawing Sheets

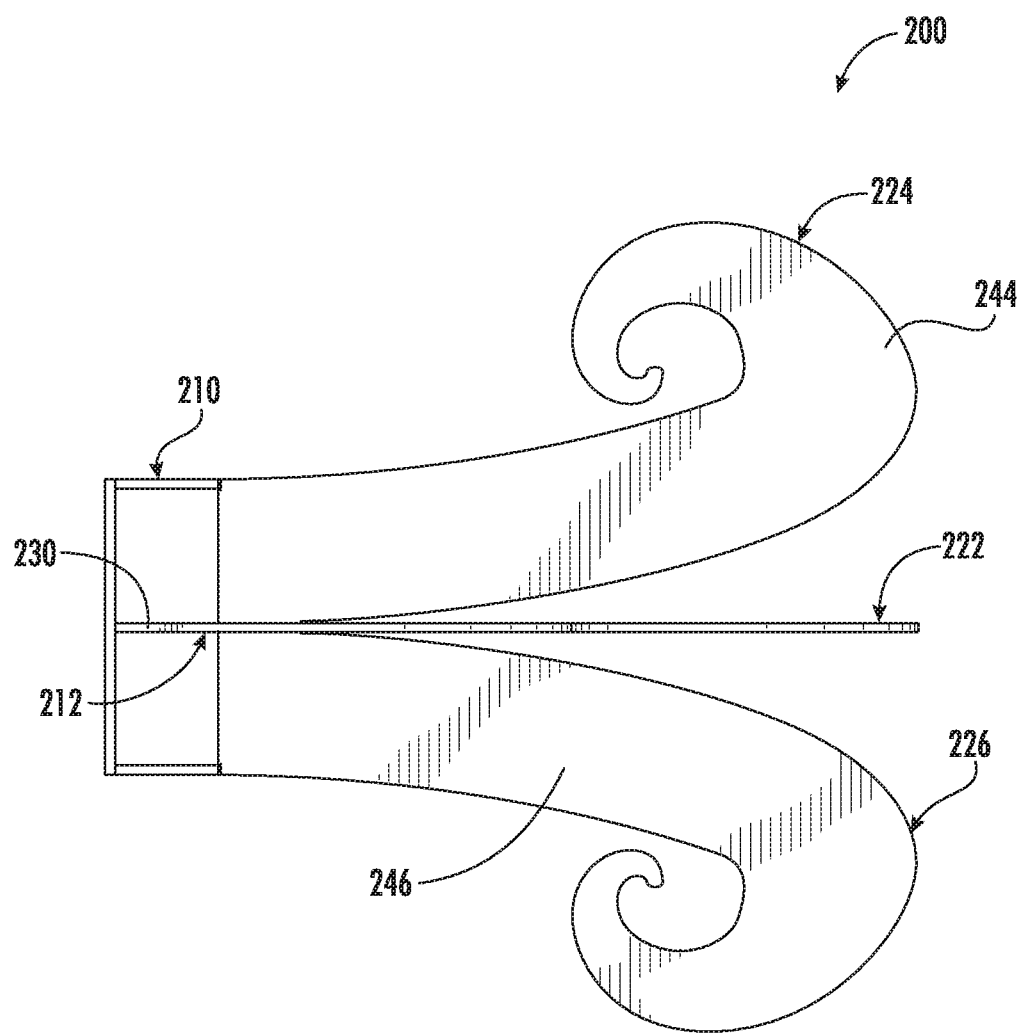
FIG. 3
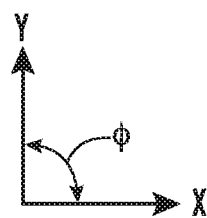

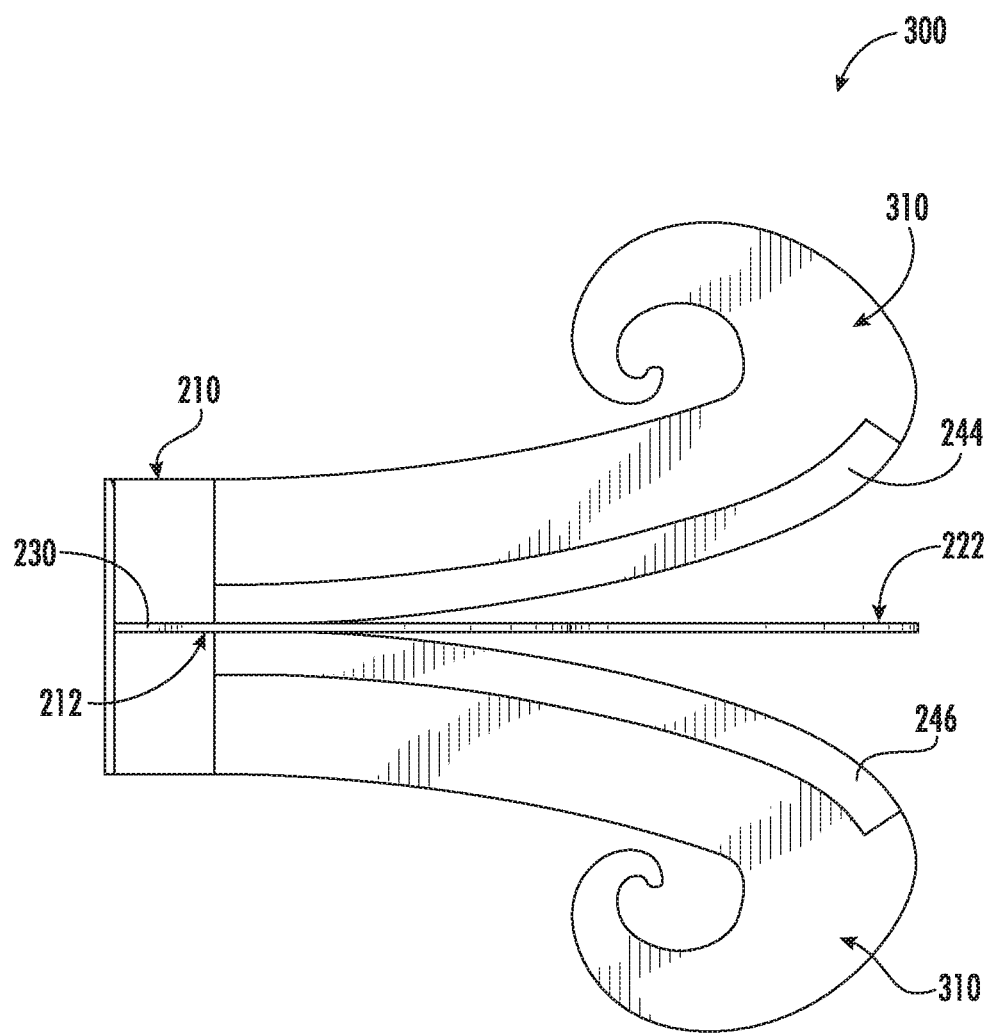
FIG. 5
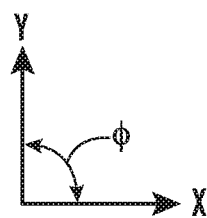

HORN ANTENNAS FOR USE IN A RADIO FREQUENCY ANECHOIC TEST CHAMBER

PRIORITY CLAIM

The present application claims the benefit of priority of U.S. Provisional App. No. 62/879,732, titled "Horn Antennas for use in a Radio Frequency Anechoic Test Chamber," having a filing date of Jul. 29, 2019, which is incorporated by reference herein.

FIELD

The present disclosure relates generally to horn antennas for use in radio frequency (RF) anechoic test chambers.

BACKGROUND

Horn antennas can be used to measure performance (e.g., gain, efficiency, etc.) of a test antenna disposed within a RF anechoic test chamber. However, in order to accurately measure performance of the test antenna over a wide bandwidth, side lobes associated with a radiation pattern of the horn antennas can pose challenges. Radiation patterns of horn antennas have large side lobes at higher frequencies (e.g., greater than about 4 gigahertz (GHZ) on conventional wideband horn antennas). As such, horn antennas present difficulties with accurately measuring performance of test antennas at these higher frequencies.

SUMMARY

Aspects and advantages of embodiments of the present disclosure will be set forth in part in the following description, or may be learned from the description, or may be learned through practice of the embodiments.

In one aspect, a horn antenna configured for use in a RF anechoic test chamber is provided according to example embodiments of the present disclosure. The horn antenna includes one or more conductive radiating elements. The horn antenna further includes an electromagnetic interference (EMI) suppressing material covering at least a portion of a surface of the one or more conductive radiating elements such that the EMI suppressing material at least partially suppresses a surface current associated with the surface of the one or more conductive radiating elements during a test operation.

In another aspect, a system for obtaining data indicative of performance of a test antenna positioned within a RF anechoic test chamber is provided. The system includes a test antenna disposed within the RF anechoic test chamber. The system further includes a horn antenna disposed within the RF anechoic test chamber. The horn antenna is configured to obtain data indicative of performance of the test antenna. The horn antenna includes one or more conductive radiating elements. The horn antenna further includes an EMI suppressing material covering at least a portion of a surface of the one or more conductive radiating elements of the horn antenna such that the EMI suppressing material at least partially suppresses a surface current associated with the surface of the one or more conductive radiating elements of the horn antenna when the horn antenna is obtaining the data indicative of performance of the test antenna.

In yet another aspect, an open-boundary horn antenna configured for use in a radio-frequency (RF) anechoic test chamber is provided. The open-boundary horn antenna includes at least two conductive radiating elements. The open-boundary horn antenna further includes an EMI suppressing material covering at least a portion of a surface of one or more of the at least two conductive radiating elements such that the EMI suppressing material at least partially suppresses a surface current associated with the surface during a test operation.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which:

FIG. 3 depicts a side view of the horn antenna of FIG. 2 according to example embodiments of the present disclosure;

FIG. 5 depicts a side view of the horn antenna of FIG. 4 according to example embodiments of the present disclosure;

DETAILED DESCRIPTION

Figure 1:
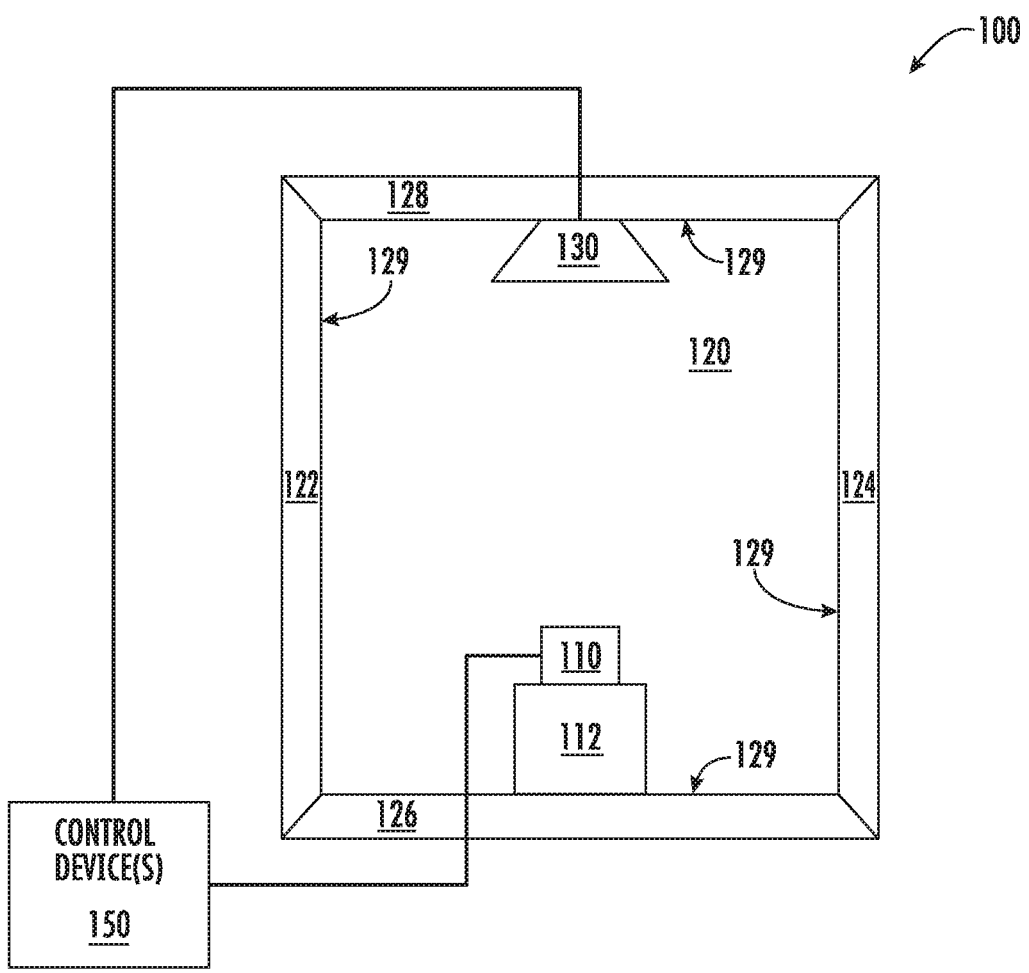
FIG. 1 depicts a block diagram of components of a system for testing performance of antennas according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to horn antennas for use within an anechoic test chamber. Horn antennas can be used to measure performance (e.g., gain, efficiency, etc.) of a test antenna disposed within a RF anechoic test chamber. However, in order to accurately measure performance of the test antenna over a wide bandwidth, it can be desirable to reduce side lobes associated with a radiation pattern of the horn antennas. Radiation patterns of conventional horn antennas have large side lobes at high frequencies, such as greater than about 4 gigahertz (GHz). Although corrugation can be added to one or more conductive ridges or radiating elements of conventional horn antennas to reduce these side lobes, corrugation can be difficult to implement in certain horn antenna structures.

According to example aspects of the present disclosure, a horn antenna can include one or more conductive ridges or radiating elements formed from a metal. For instance, in some implementations, the one or more conductive radiating elements can be formed from aluminum. The horn antenna can include an electromagnetic interference (EMI) suppressing material covering at least a portion of a surface of the one or more conductive radiating elements. In some implementations, the EMI suppressing material can include an adhesive backing to facilitate attaching the EMI suppressing material to the surface of the one or more conductive radiating elements.

In some implementations, the EMI suppressing material can be an elastomeric material. For instance, in some implementations, the elastomeric material can be a silicone rubber. In this manner, the elastomeric material can be cut into individual strips and bonded to the surface of a corresponding conductive radiating element. Alternatively and/or additionally, the elastomeric material can include ferrite (e.g., ferrimagnetic ceramic iron oxides). In some implementations, the ferrite can be deposited throughout the silicone rubber. In alternative implementations, the elastomeric material can include metal nanoparticles such as, for instance, nickel, cobalt, iron, or copper. In some implementations, the metal nanoparticles can be deposited through the silicone rubber.

In some implementations, a relative permittivity CR of the EMI suppressing material can range from about 15 to about 45. Alternatively and/or additionally, a relative permeability $\mu_R$ of the EMI suppressing material can range from about 1 to about 6. More specifically, in some implementations, the relative permeability $\mu_R$ of the EMI suppressing material can range from 2 to 3.

The horn antenna according to the present disclosure can provide numerous technical benefits. For instance, the EMI suppressing material at least partially covering the surface of the one or more conductive radiating elements can suppress a surface current associated with the surface of the one or more conductive radiating elements during a test operation in which the horn antenna is used to obtain data indicative of performance of a test antenna disposed within a RF anechoic test chamber. Suppressing the surface current can reduce the side lobes of a radiation pattern associated with the horn antenna. In this manner, the horn antenna according to example aspects of the present disclosure can more accurately measure performance of the test antenna at higher frequencies (e.g., about 4 GHz to about 18 GHz) as compared to conventional horn antennas.

As used herein, the use of the term "about" in conjunction with a numerical value is intended to refer to within 20% of the stated amount. In addition, the terms "first," "second" "third" and "fourth" can be used interchangeably to distinguish one component from another and are not intended to signify location or importance of the individual components.

Referring now to FIG. 1, a system 100 for testing performance of antennas positioned within a radio frequency (RF) anechoic test chamber 120 is provided according to example embodiments of the present disclosure. As shown, the system 100 can include a test antenna 110 positioned within the RF anechoic test chamber 120. In some implementations, the test antenna 110 can be positioned on a support or pedestal 112 disposed within the RF anechoic test chamber 120. The system 100 can further include a horn antenna 130 positioned within the RF anechoic test chamber 120. In some implementations, the horn antenna 130 can be suspended from one of walls 122, 124, 126, 128 defining the RF anechoic test chamber 120. The horn antenna 130 can be used to obtain data indicative of performance of the test antenna 110. For instance, the horn antenna 130 can be used to obtain data indicative of a radiation pattern associated with the test antenna 110 over a range of frequencies.

In some implementations, a surface 129 of one or more of the walls 122, 124, 126, 128 defining the RF anechoic test chamber 120 can be covered with RF absorbent material (not shown). It should be understood that the RF absorbent material can be configured to absorb incident RF radiation within the RF anechoic test chamber 120. In this manner, reflected RF radiation within the RF anechoic test chamber 120 can be reduced.

In some implementations, the system 100 can include one or more control devices 150. The one or more control devices 150 can be operatively coupled to the test antenna 110. In this manner, the one or more control devices 150 can control operation of the test antenna 110 to tune the test antenna 110 to a desired test frequency. In addition, the one or more control devices 150 can be operatively coupled to the horn antenna 130. For instance, the one or more control devices 150 can control operation of the horn antenna 130 to tune the horn antenna 130 to the desired test frequency. In this manner, the one or more control devices 150 can configure the horn antenna 130 to obtain data indicative of performance of the test antenna 110 at the desired test frequency.

Figure 2:
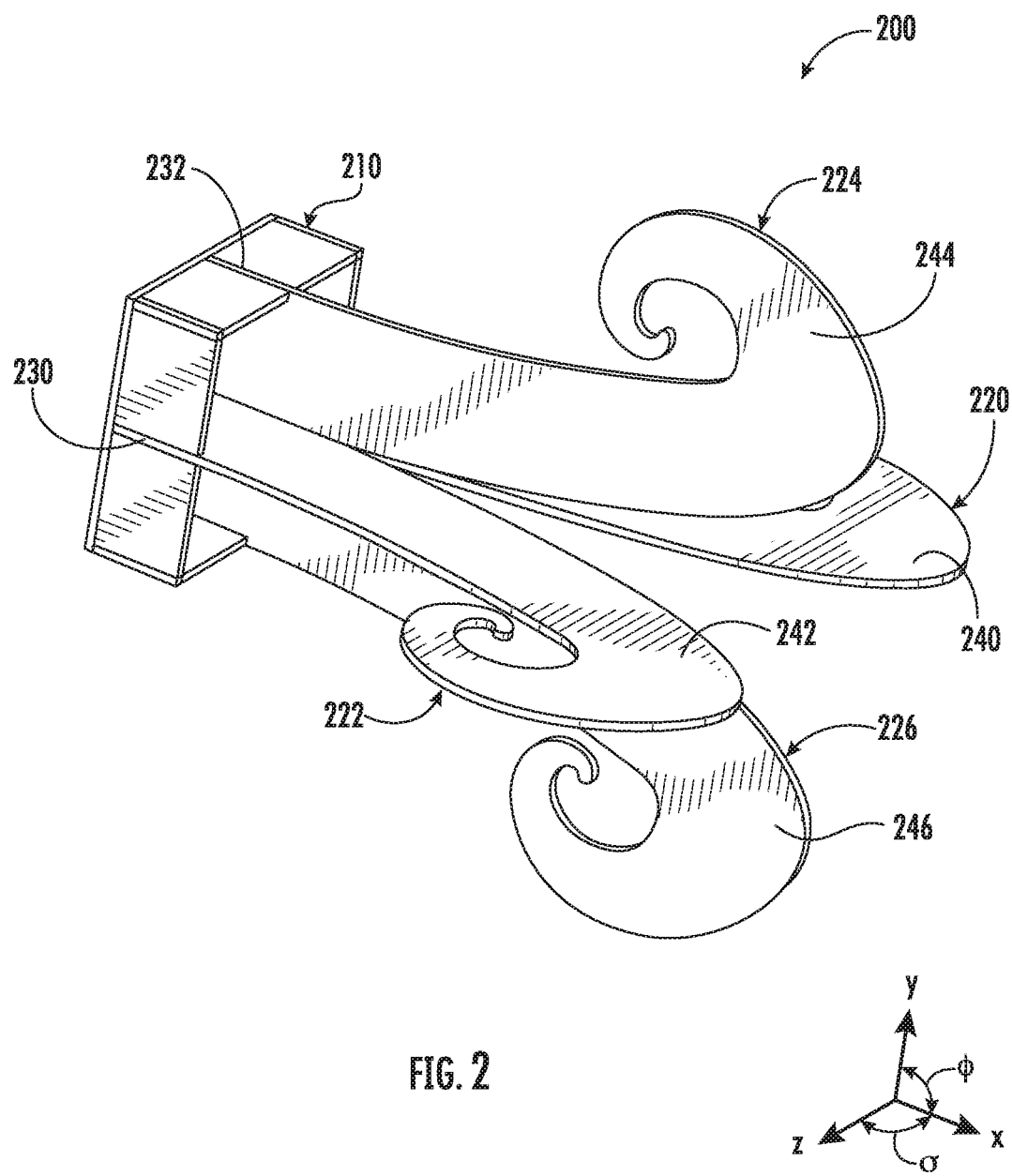
FIG. 2 depicts a perspective view of a horn antenna according to example embodiments of the present disclosure.

Referring now to FIGS. 2 and 3, an example horn antenna 200 for use in a RF anechoic test chamber, such as the RF anechoic test chamber 120 discussed above with reference to FIG. 1, is provided according to example embodiments of the present disclosure. As shown, the horn antenna 200 can define a coordinate system that includes an X-direction, a Y-direction, and a Z-direction. The horn antenna 200 can be configured to operate at any suitable frequency. For instance, in some implementations, the horn antenna 200 can be configured to operate over a range of frequencies that spans from about 0.5 GHz to about 18 GHz. In this manner, the horn antenna 200 can be configured to obtain data indicative of performance of a test antenna, such as the test antenna 110 discussed above with reference to FIG. 1, over the range of frequencies.

As shown, the horn antenna 200 can include a base 210. The horn antenna 200 can further include one or more conductive radiating elements or ridges. For instance, the horn antenna 200 can include a first conductive radiating element 220, a second conductive radiating element 222, a third conductive radiating element 224, and a fourth conductive radiating element 226. Furthermore, as shown, the conductive radiating elements 220, 222, 224, 226 are not surrounded by an enclosure. In this manner, the horn antenna 200 can be considered an open boundary quad-ridged horn antenna.

In alternative implementations, the horn antenna 200 can include more or fewer conductive radiating elements. For instance, in some implementations, the horn antenna 200 can include at least two conductive radiating elements. Alternatively or additionally, the horn antenna 200 can, in some implementations, include an enclosure surrounding the one or more conductive radiating elements.

It should be understood that the conductive radiating elements 220, 222, 224, 226 can be formed from any suitable metal or other conductive element. For instance, in some implementations, the conductive radiating elements 220, 222, 224, 226 can be formed from aluminum. It should also be understood that the conductive radiating elements 220, 222, 224, 2226 can have any suitable shape. For instance, in some implementations, each of the conductive radiating elements 220, 222, 224, 226 can have a curved horn shape.

As shown, each of the conductive radiating elements 220, 222, 224, 226 can be secured to the base 210 of the of the horn antenna 200. For instance, the base 210 can define a plurality of slots 212 to accommodate the conductive radiating elements 220, 222, 224, 226. In this manner, each of the conductive radiating elements 220, 222, 224, 226 can be inserted into a corresponding slot of the plurality of slots 212 to secure the conductive radiating elements 220, 222, 224, 226 to the base 210. In some implementations, the first conductive radiating element 220 and the second conductive radiating element 222 can each be coupled to a first RF feed (not shown) at a first port 230, whereas the third conductive radiating element 224 and the fourth conductive radiating element 226 can each be coupled to a second RF feed (not shown) at a second port 232 that is different than the first port 230. In this manner, the horn antenna 200 can receive RF signals from two separate feeds (e.g., first RF feed, second RF feed).

In some implementations, the first conductive radiating element 220 and the second conductive radiating element 222 can be secured to the base 210 such that the first conductive radiating element 220 and the second conductive radiating element 222 are oriented to have a first polarization (e.g., horizontal polarization). Conversely, the third conductive radiating element 224 and the fourth conductive radiating element 226 can be secured to the base 210 such that the third conductive radiating element 224 and the fourth conductive radiating element 226 are oriented to have a second polarization (e.g., vertical polarization) that is different than the first polarization. In this manner, the horn antenna 200 can be considered a dual-polarization quad-ridged horn antenna.

Figure 4:
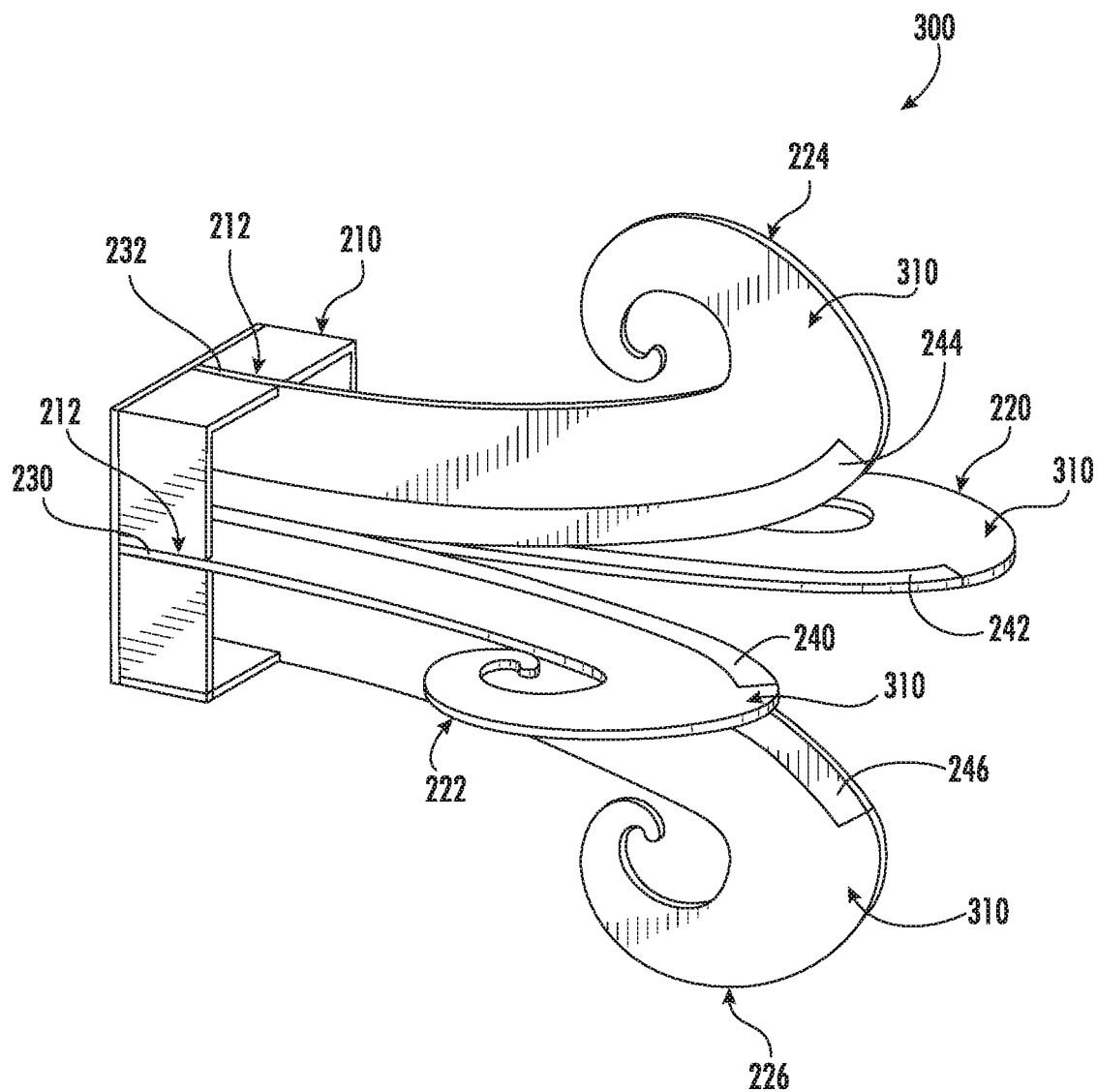
FIG. 4 depicts a perspective view of a horn antenna according to example embodiments of the present disclosure.

Referring now to FIGS. 4 and 5, an example horn antenna 300 according to example embodiments of the present disclosure is provided. As shown, the horn antenna 300 of FIGS. 4 and 5 can be configured in substantially the same manner as the horn antenna 200 discussed above with reference to FIGS. 2 and 3. However, in contrast to the horn antenna 200 of FIGS. 2 and 3, the horn antenna 300 of FIGS. 4 and 5 includes an electromagnetic interference (EMI) suppressing material 310 at least partially covering a surface 240 of the first conductive radiating element 220, a surface 242 of the second conductive radiating element 222, a surface 244 of the third conductive radiating element 224, and a surface 246 of the fourth conductive radiating element 226.

It should be understood that, in some implementations, the EMI suppressing material 310 can at least partially cover the surface 240, 242, 244, 246 of fewer than each of the conductive radiating elements 220, 222, 224, 226. For instance, in some implementations, only the surface 240 of the first conductive radiating element 220 and the surface 242 of the second conductive radiating element 222 can be at least partially covered with the EMI suppressing material 310. In alternative implementations, only the surface 244 of the third conductive radiating element 224 and the surface 246 of the fourth conductive radiating element 226 can be at least partially covered with the EMI suppressing material 310.

When the EMI suppressing material 310 at least partially covers the surface 240, 242, 244, 246 of the conductive radiating elements 220, 222, 224, 226, the EMI suppressing material 310 at least partially suppresses a surface current associated with the surface 240, 242, 244, 246 of the conductive radiating elements 220, 222, 224 226 while the horn antenna 300 obtains data indicative of performance of the test antenna 110 (FIG. 1). More specifically, the EMI suppressing material 310 can suppress the surface current such that a side lobe level of a radiation pattern associated with the horn antenna 300 is reduced relative to the radiation pattern associated with the horn antenna 200 of FIGS. 2 and 3. The reduction of the side lobe level can improve the accuracy of data the horn antenna 300 obtains over the range of frequencies, especially at higher frequencies (e.g., about 4 GHz to about 18 GHz). In this manner, the horn antenna 300 of FIGS. 4 and 5 can more accurately measure performance of the test antenna 110 (FIG. 1) over the range of frequencies as compared to the horn antenna 200 of FIGS. 2 and 3.

In some implementations, the EMI suppressing material 310 can be an elastomeric material. For instance, the elastomeric material can be a silicone rubber. In this manner, the elastomeric material can be cut into individual strips and bonded to the surface 240, 242, 244, 246 of a corresponding conductive radiating element 220, 222, 224, 226. In some implementations, the elastomeric material can include ferrite (e.g., ferrimagnetic ceramic iron oxides). For instance, in some implementations, the ferrite can be deposited throughout the silicone rubber. In alternative implementations, the elastomeric material can include metal nanoparticles. Example metal nanoparticles can include, without limitation, nickel, cobalt, iron or copper. In some implementations, the metal nanoparticles can be deposited through the silicone rubber.

It should be appreciated, however, the elastomeric material can include any suitable type of dielectric material configured to suppress the surface current associated with the surface 240, 242, 244, 246 of the conductive radiating elements 220, 222, 224, 226 while the horn antenna 300 is being used during a test operation to obtain data indicative of performance of the test antenna 110.

In some implementations, the EMI suppressing material 310 can include an adhesive backing to facilitate bonding the EMI suppressing material 310 to the surface 240, 242, 244, 246 of the conductive radiating elements 220, 222, 224, 226. It should be appreciated that the EMI suppressing material 310 can have any suitable thickness. For instance, in some implementations, a thickness of the EMI suppressing material 310 can range from about 1 millimeter to about 5 millimeters.

In some implementations, a relative permittivity CR of the EMI suppressing material 310 can range from about 15 to about 45. Alternatively or additionally, a relative permeability $\mu_R$ of the EMI suppressing material 310 can range from about 1 to about 6. More specifically, in some implementations, the relative permeability $\mu_R$ of the EMI suppressing material 310 can range from 2 to 3.

Although the horn antenna 300 discussed above with reference to FIGS. 3 through 4 is depicted as being open-boundary quad-ridged horn antennas, it should be appreciated that the horn antenna 300 can be configured as any suitable type of measurement horn antenna. For instance, in some implementations, the horn antenna 300 can be configured as a closed boundary quad-ridged horn antenna. In alternative implementations, the horn antenna 300 can be configured as a dual-ridged horn antenna. More specifically, the horn antenna 300 can be an open-boundary dual-ridged antenna. In other implementations, the horn antenna 300 can be a closed boundary dual-ridged antenna. In still other implementations, the horn antenna 300 can be a Vivaldi antenna. As such, it should be appreciated that the horn antenna 300 can be configured as any suitable type of antenna for use in RF anechoic test chambers, such as the RF anechoic test chamber 120 discussed above with reference to FIG. 1.

Figure 6:
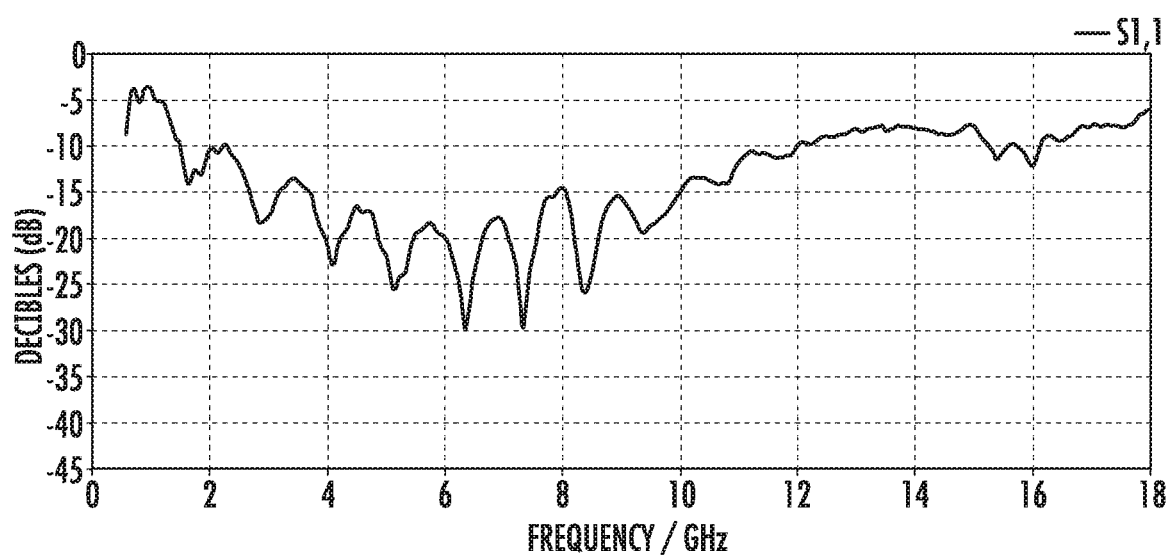
FIG. 6 depicts a graphical representation of return loss associated with the horn antenna of FIG. 2 according to example embodiments of the present disclosure.
Figure 7:
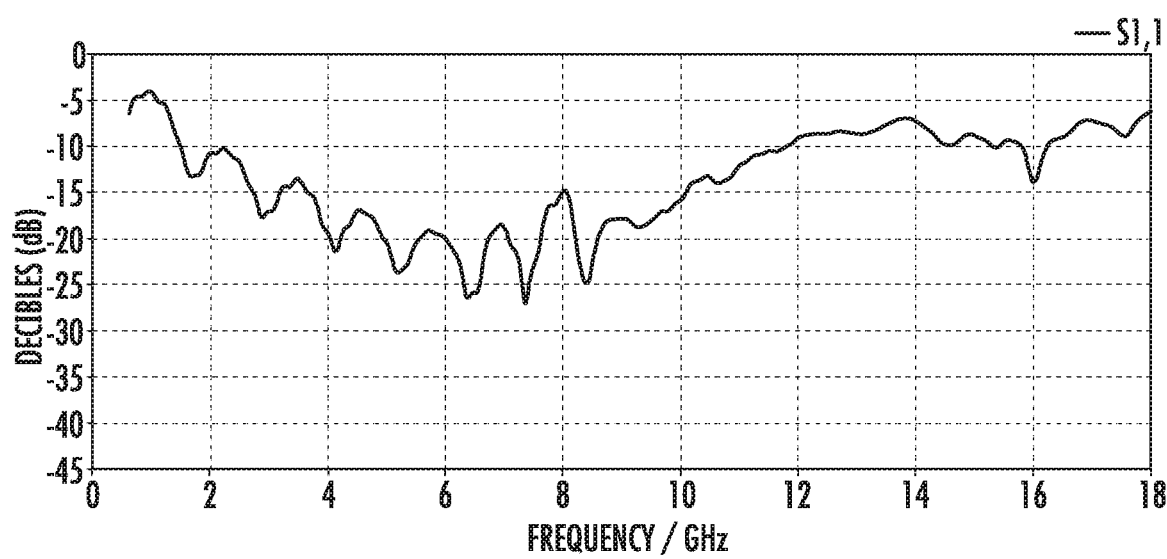
FIG. 7 depicts a graphical representation of return loss associated with the horn antenna of FIG. 4 according to example embodiments of the present disclosure.

Referring now to FIGS. 6 and 7, graphical representations of return loss of the horn antennas 200, 300 are provided according to example embodiments of the present disclosure. As shown, the graphs illustrate return loss (denoted along the vertical axis in decibels) associated with the first port 230 of the horn antennas 200, 300 as a function of frequency (denoted along the horizontal axis in gigahertz). More specifically, the graphs illustrate return loss of the horn antennas 200, 300 over a range of frequencies that spans from 0.5 GHz to 18 GHz.

It should be understood that the graph of FIG. 6 depicts the return loss of the horn antenna 200 depicted in FIG. 2, whereas FIG. 7 depicts the return loss of the horn antenna 300 depicted in FIG. 4. As may be seen, adding the EMI suppressing material 310 to at least partially cover the surface 240, 242, 244, 246 of the conductive radiating elements 220, 222, 224, 226 does not significantly impact the return loss of the horn antenna 300.

Figure 8:
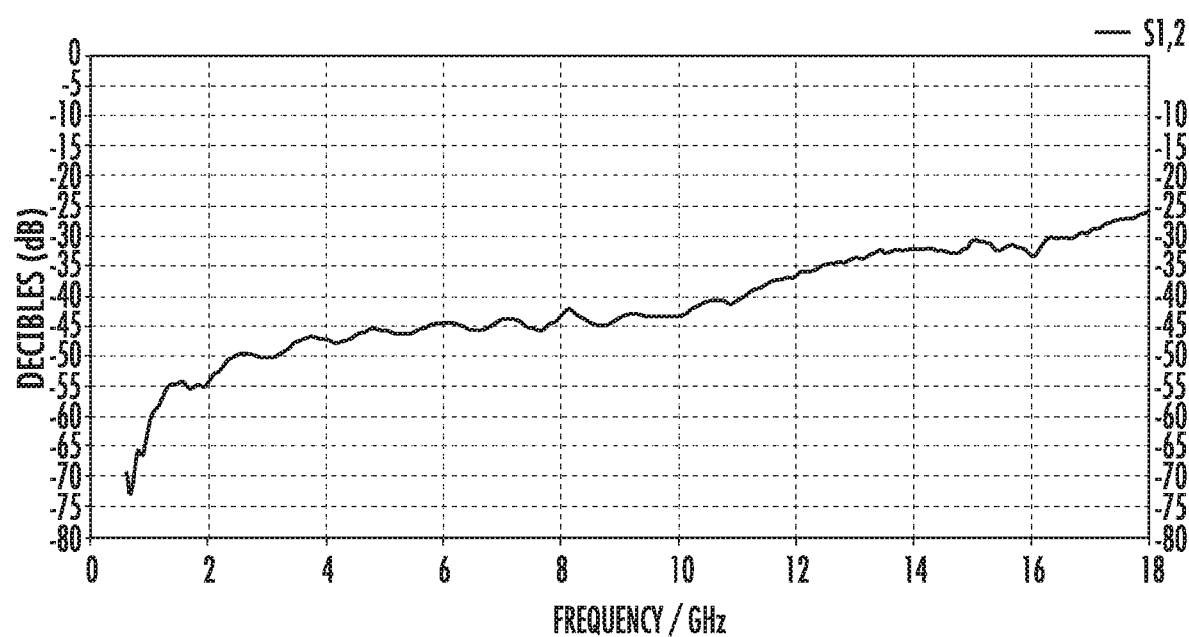
FIG. 8 depicts a graphical representation of isolation between a first port and a second port of the horn antenna of FIG. 2 according to example embodiments of the present disclosure.
Figure 9:
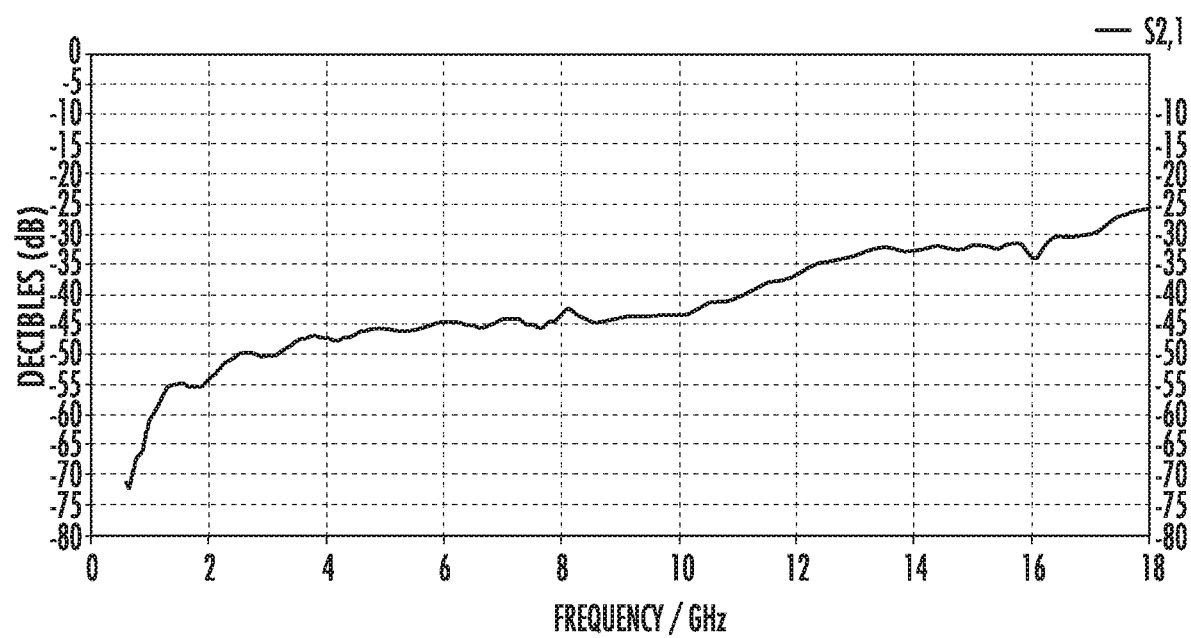
FIG. 9 depicts a graphical representation of isolation between a first port and a second port of the horn antenna of FIG. 4 according to example embodiments of the present disclosure.

Referring now to FIGS. 8 and 9, graphical representations of isolation between the first port 230 and the second port 232 of the horn antennas 200, 300 are provided. As shown, the graphs illustrate isolation (denoted along the vertical axis in decibels) of the first port 230 and the second port 232 from one another as a function of frequency (denoted along the horizontal axis in gigahertz). More specifically, the graphs illustrate return loss of the horn antennas 200, 300 over a range of frequencies that spans from 0.5 GHz to 18 GHz.

It should be understood that the graph of FIG. 8 depicts isolation between the first port 230 and the second port 232 of the horn antenna 200 depicted in FIG. 2, whereas FIG. 7 depicts isolation between the first port 230 and the second port 232 of the horn antenna 300 depicted in FIG. 4. As may be seen, adding the EMI suppressing material 310 to at least partially cover the surface 240, 242, 244, 246 of the conductive radiating elements 220, 222, 224, 226 does not significantly impact the isolation characteristics of the horn antenna 300.

Figure 10:
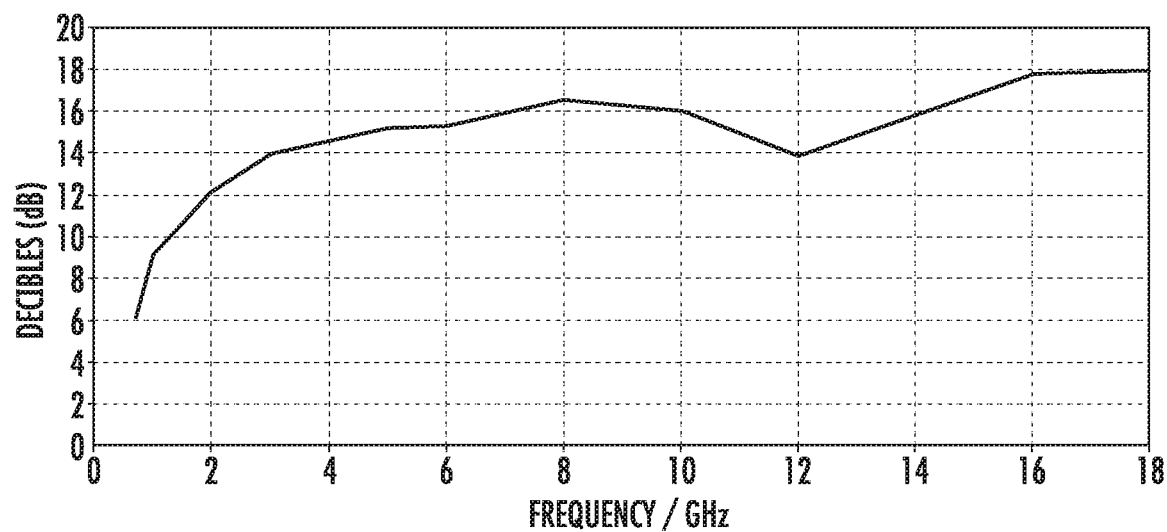
FIG. 10 depicts a graphical representation of gain on boresight of the horn antenna of FIG. 2 according to example embodiments of the present disclosure.
Figure 11:
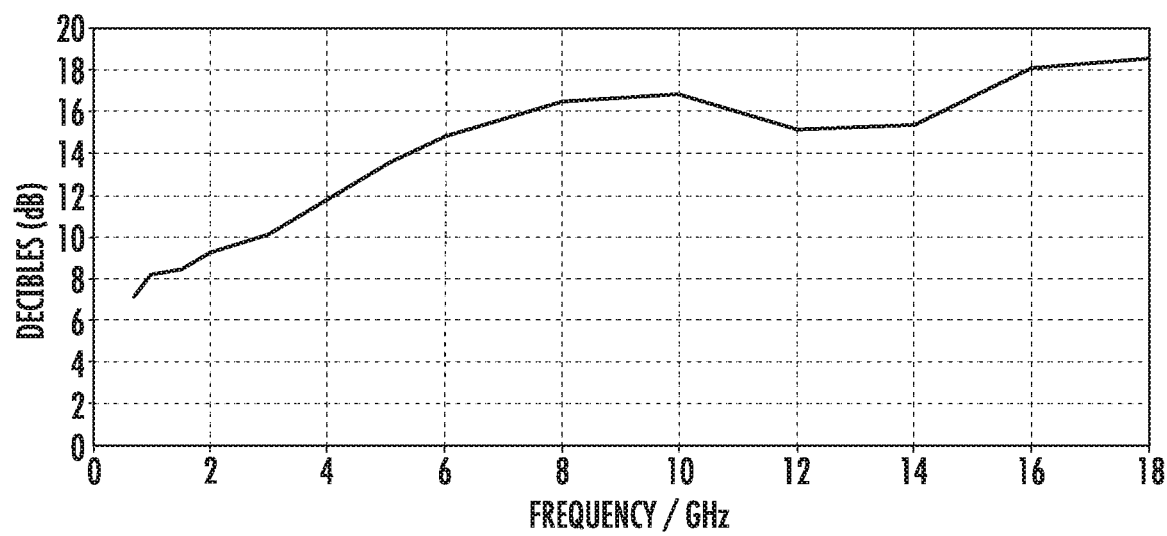
FIG. 11 depicts a graphical representation of gain on boresight of the horn antenna of FIG. 4 according to example embodiments of the present disclosure.

Referring now to FIGS. 10 and 11, graphical representations of gain on boresight of the horn antennas 200, 300 are provided. As shown, the graphs illustrate gain on boresight (denoted along the vertical axis in decibels) associated with the horn antennas 200, 300 as a function of frequency (denoted along the horizontal axis in gigahertz). More specifically, the graphs illustrate gain on boresight of the horn antennas 200, 300 over a range of frequencies that spans from 0.5 GHz to 18 GHz.

It should be understood that the graph of FIG. 10 depicts the gain on boresight of the horn antenna 200 depicted in FIG. 2, whereas FIG. 11 depicts the gain on boresight of the horn antenna 300 depicted in FIG. 4. As may be seen, adding the EMI suppressing material 310 to at least partially cover the surface 240, 242, 244, 246 of the conductive radiating elements 220, 222, 224, 226 decreases gain of the horn antenna 300 at lower frequencies (e.g., less than about 4 GHz). However, it should be understood that high antenna gain at these lower frequencies is not critical for horn antennas 300 used in RF anechoic test chambers.

Figure 12:
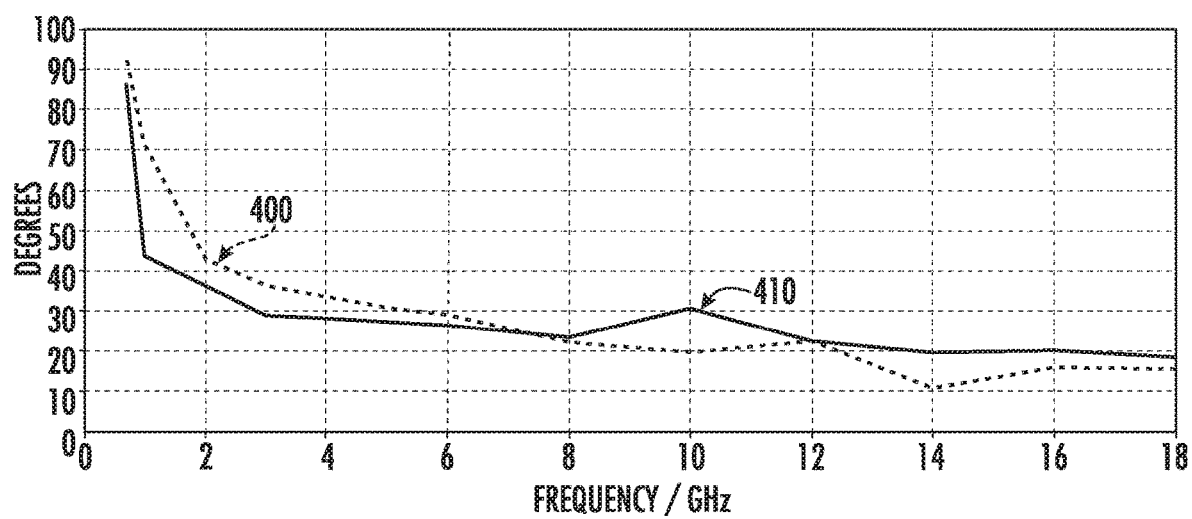
FIG. 12 depicts a graphical representation of a 3 dB beamwidth of a main lobe of a radiation pattern of the horn antenna of FIG. 2 according to example embodiments of the present disclosure.
Figure 13:
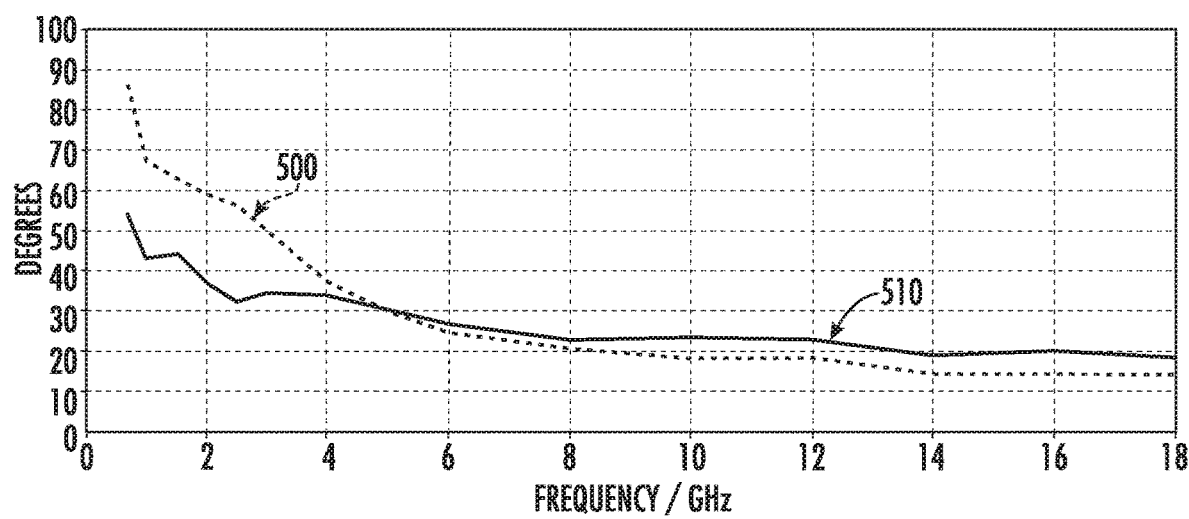
FIG. 13 depicts a graphical representation of a 3 dB beamwidth of a main lobe of a radiation pattern of the horn antenna of FIG. 4 according to example embodiments of the present disclosure.

Referring now to FIGS. 12 and 13, graphical representations of a 3 dB beamwidth of a main lobe of a radiation pattern measured at the first port 230 of the horn antennas 200, 300 is provided. As shown, the graphs illustrate the 3 dB beamwidth (denoted along the vertical axis in degrees) as a function of frequency (denoted along the horizontal axis in gigahertz).

Curve 400 and curve 410 in FIG. 12 correspond to the H-plane (e.g., out of the plane of radiating curve) and the E-plane (e.g., in the plane of the radiating curve), respectively, measured at the first port 230 of the horn antenna 200 of FIG. 2. Conversely, curve 500 and curve 510 in FIG. 13 correspond to the H-plane and the E-plane, respectively, measured at the first port 230 of the horn antenna 300 of FIG. 4.

As may be seen, the 3 dB beamwidth of the E-plane of the horn antenna 300 of FIG. 4 is lower than the 3 dB beamwidth of the E-plane of the horn antenna 200 of FIG. 2 at lower frequencies (e.g., less than about 2 GHz). It should be understood that the data the horn antenna 300 of FIG. 4 obtains indicative of performance of the test antenna 110 (FIG. 1) at the lower frequencies is more accurate compared to data the horn antenna 200 of FIG. 2. This is due, at least in part, to the 3 dB beamwidth of the horn antenna 300 of FIG. 4 at the lower frequencies being smaller relative to the 3 dB beamwidth of the horn antenna 200 of FIG. 2 at the lower frequencies.

Figure 14:
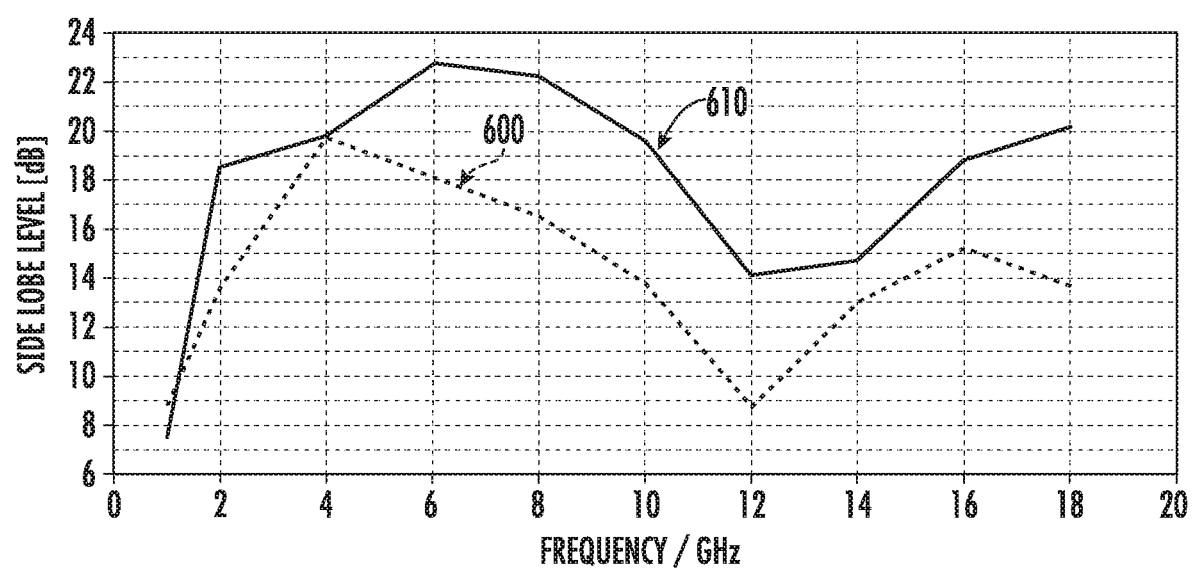
FIG. 14 depicts a graphical representation of side lobe levels of a radiation pattern of the horn antenna of FIG. 2 and the horn antenna of FIG. 4 according to example embodiments of the present disclosure.

Referring now to FIG. 14, a graphical representation of a side lobe level of a radiation pattern associated with the horn antennas 200, 300 is provided according to example embodiments of the present disclosure. As shown, the graph illustrates the side lobe level (denoted along the vertical axis in decibels) of the horn antennas 200, 300 as a function of frequency (denoted along the horizontal axis in gigahertz). More specifically, the graph illustrates the side lobe level of the horn antennas 200, 300 over a range of frequencies that spans from 0.5 GHz to 18 GHz.

Curve 600 corresponds to the radiation pattern of the horn antenna 200 of FIG. 2 and denotes the side lobe level of the radiation pattern measured in the XZ plane over the range of frequencies (e.g., 0.5 GHz to 18 GHz). Curve 610 corresponds to the radiation pattern of the horn antenna 300 of FIG. 4 and denotes the side lobe level of the radiation pattern measured in the XZ plane over the range of frequencies. As may be seen, the side lobe level of the radiation pattern of the horn antenna 300 of FIG. 4 is reduced as compared to the side lobe level of the radiation pattern of the horn antenna 200 of FIG. 2 over a range of frequencies greater than about 4 GHz. In this manner, the EMI suppressing material 310 at least partially covering the one or more conductive radiating elements 220, 222, 224, 226 of the horn antenna 300 of FIG. 4 can aide in reducing the side lobe level of the radiation pattern of the horn antenna 300 of FIG. 4. More specifically, the EMI suppressing material 310 can, as discussed above, suppress the surface current associated with the surface of the one or more conductive radiating elements 220, 222, 224, 226 such that the side lobe level of the radiation pattern associated with the horn antenna 300 is reduced.

Figure 15:
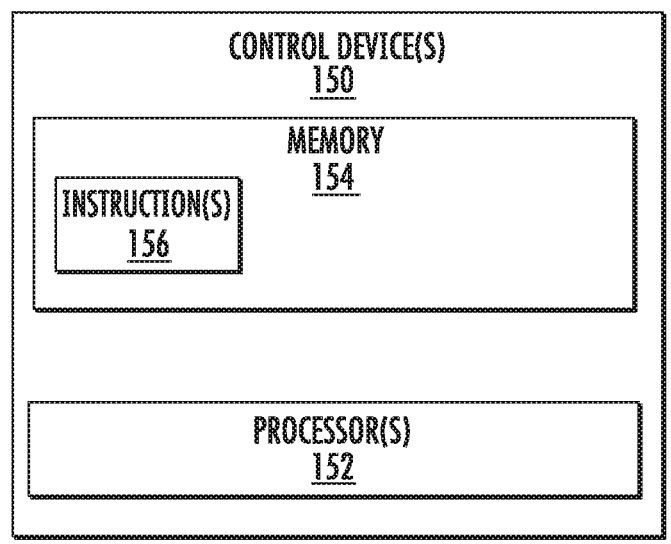
FIG. 15 depicts a block diagram of components of a control device according to example embodiments of the present disclosure.

FIG. 15 depicts a block diagram of an example control device 150. As shown, the control device 150 can include one or more processors 152 and one or more memory devices 154. The processor(s) 152 can include any suitable processing device, such as a microprocessor, microcontroller, integrated circuit, logic device, or other suitable processing device. The memory device(s) 154 can include one or more computer-readable media, including, but not limited to, non-transitory computer-readable media, RAM, ROM, hard drives, flash drives, or other memory devices.

The memory device(s) 154 can store information accessible by the processor(s) 152, including computer-readable instructions 156 that can be executed by the processor(s) 152. The computer-readable instructions 156 can be any set of instructions that, when executed by the processor(s) 152, cause the processor(s) 152 to perform operations. The computer-readable instructions 156 can be software written in any suitable programming language or may be implemented in hardware. In some embodiments, the computer-readable instructions 156 can be executed by the processor(s) 152 to cause the processor(s) 152 to perform operations, such as controlling operation of the horn antenna 140 (FIG. 1) to obtain data indicative of performance of the test antenna 110 (FIG. 1).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A horn antenna configured for use in a radio frequency (RF) anechoic test chamber, the horn antenna comprising:
   a plurality of conductive radiating elements; and
   an electromagnetic interference (EMI) suppressing material covering at least a portion of a surface of the plurality of conductive radiating elements such that the EMI suppressing material at least partially suppresses a surface current associated with the surface of the plurality of conductive radiating elements during a test operation, the EMI suppressing material being attached to the surface of the plurality of conductive radiating elements via an adhesive backing of the ENE suppressing material,
   wherein the EMI suppressing material comprises an elastomeric material comprising silicon rubber, and
   wherein the elastomeric material further comprises ferrite deposited throughout the silicon rubber and metal nanoparticles deposited throughout the silicon rubber.

2. The horn antenna of claim 1, wherein the EMI suppressing material at least partially suppresses the surface current associated with the surface of the plurality of conductive radiating elements during the test operation such that a side lobe level of a radiation pattern associated with the horn antenna is reduced.

3. The horn antenna of claim 1, wherein the plurality of conductive radiating elements comprise:
   a first conductive radiating element and a second conductive radiating element, the first conductive radiating element and the second conductive radiating element each having a horizontal polarization.

4. The horn antenna of claim 3, wherein the plurality of conductive radiating elements further comprise:
   a third conductive radiating element and a fourth conductive radiating element, the third conductive radiating element and the fourth conductive radiating element each having a vertical polarization.

5. The horn antenna of claim 1, wherein the plurality of conductive radiating elements have a curved horn shape.

6. The horn antenna of claim 1, wherein the horn antenna is operable over a range of frequencies spanning from 0.5 gigahertz (GHz) to 18 GHz.

7. The horn antenna of claim 1, wherein a relative permittivity of the EMI suppressing material is in a range from about 15 to about 45.

8. The horn antenna of claim 1, wherein a relative permeability of the EMI suppressing material is in a range from about 1 to about 6.

9. The horn antenna of claim 1, wherein a thickness of the EMI suppressing material is between about 1 millimeter and about 5 millimeters.

10. A system for obtaining data indicative of performance of a test antenna positioned within a RF anechoic test chamber, the system comprising:
    a test antenna disposed within the RF anechoic test chamber; and
    a horn antenna disposed within the RF anechoic test chamber, the horn antenna configured to obtain data indicative of performance of the test antenna, the horn antenna comprising:
    a plurality of conductive radiating elements; and
    an electromagnetic interference (EMI) suppressing material covering at least a portion of a surface of the plurality of conductive radiating elements of the horn antenna such that the EMI suppressing material at least partially suppresses a surface current associated with the surface of the plurality of conductive radiating elements of the horn antenna when the horn antenna is obtaining the data indicative of performance of the test antenna, the EMI suppressing material being attached to the surface of the plurality of conductive radiating elements via an adhesive backing of the EMI suppressing material,
    wherein the EMI suppressing material comprises an elastomeric material comprising silicon rubber, and
    wherein the elastomeric material further comprises ferrite deposited throughout the silicon rubber and metal nanoparticles deposited throughout the silicon rubber.

11. The system claim 10, wherein the EMI suppressing material at least partially suppresses the surface current associated with the surface of the plurality of conductive radiating elements such that a side lobe level of a radiation pattern associated with the horn antenna is reduced during a test operation.

12. The system of claim 10, wherein the plurality of conductive radiating elements comprise:
    a first conductive radiating element and a second conductive radiating element, the first conductive radiating element and the second conductive radiating element each having a horizontal polarization.

13. The system of claim 12, wherein the plurality of conductive radiating elements further comprise:
    a third conductive radiating element and a fourth conductive radiating element, the third conductive radiating element and the fourth conductive radiating element each having a vertical polarization.

14. An open-boundary horn antenna configured for use in a radio frequency (RF) anechoic test chamber, the open-boundary horn antenna comprising:
    at least two conductive radiating elements; and
    an electromagnetic interference (EMI) suppressing material covering at least a portion of a surface of one or more of the at least two conductive radiating elements such that the EMI suppressing material at least partially suppresses a surface current associated with the surface during a test operation, the EMI suppressing material being attached to the surface of the at least two conductive radiating elements via an adhesive backing of the EMI suppressing material,
    wherein the EMI suppressing material comprises an elastomeric material comprising silicon rubber, and
    wherein the elastomeric material further comprises ferrite deposited throughout the silicon rubber and metal nanoparticles deposited throughout the silicon rubber.

15. The open-boundary horn antenna of claim 14, wherein the at least wo conductive radiating elements comprises:
    a first conductive radiating element and a second conductive radiating element, the first conductive radiating element and the second conductive radiating element each having a horizontal polarization; and
    a third conductive radiating element and a fourth conductive radiating element, the third conductive radiating element and the fourth conductive radiating element each having a vertical polarization.

16. The system of claim 15, further comprising:
    one or more control devices operatively coupled to at least one of the test antenna or the horn antenna for tuning at least one of the test antenna or the horn antenna to a desired frequency.

\* \* \* \* \*